United States Patent
Inoue et al.

(10) Patent No.: US 10,643,703 B2
(45) Date of Patent: *May 5, 2020

(54) SEMICONDUCTOR MEMORY DEVICE HAVING A SEMICONDUCTOR CHIP INCLUDING A MEMORY CELL AND A RESISTANCE ELEMENT

(71) Applicant: TOSHIBA MEMORY CORPORATION, Minato-ku, Tokyo (JP)

(72) Inventors: Satoshi Inoue, Zushi Kanagawa (JP); Daisuke Arizono, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/363,850

(22) Filed: Mar. 25, 2019

(65) Prior Publication Data

US 2019/0221265 A1 Jul. 18, 2019

Related U.S. Application Data

(63) Continuation of application No. 15/699,847, filed on Sep. 8, 2017, now Pat. No. 10,283,201.

(30) Foreign Application Priority Data

Mar. 24, 2017 (JP) .................. 2017-060033

(51) Int. Cl.
*G11C 16/06* (2006.01)
*G11C 7/10* (2006.01)
(Continued)

(52) U.S. Cl.
CPC ............... *G11C 16/06* (2013.01); *G11C 7/10* (2013.01); *G11C 7/1057* (2013.01);
(Continued)

(58) Field of Classification Search
CPC ........... G11C 16/06; G11C 16/26; G11C 7/10; G11C 7/1084; G11C 7/1057;
(Continued)

(56) References Cited

U.S. PATENT DOCUMENTS 8,598,889 B2 12/2013 Cho
9,064,590 B2* 6/2015 Ueda .................. G11C 11/1673
(Continued)

*Primary Examiner* — Tha-O H Bui
(74) *Attorney, Agent, or Firm* — Holtz, Holtz & Volek PC

(57) ABSTRACT

A method for controlling a memory system, including a controller chip and a non-volatile memory chip which includes a calibration control circuit, a first output buffer, and a first resistance element, includes receiving a read command from the controller, setting a ready/busy signal to a busy state based on the read command, executing a calibration operation which controls an impedance of the first output buffer based on the read command, setting the ready/busy signal to a ready state, and sending data to the control chip in response to the read command. The calibration control circuit calibrates the impedance of the first output buffer circuit by using the first resistance element within a period in which the ready/busy signal is the busy state.

11 Claims, 9 Drawing Sheets

(51) Int. Cl.
*G11C 16/26* (2006.01)
*G11C 11/00* (2006.01)
*G11C 7/04* (2006.01)
*G11C 16/04* (2006.01)

(52) U.S. Cl.
CPC ............ *G11C 7/1084* (2013.01); *G11C 16/26* (2013.01); *G11C 7/04* (2013.01); *G11C 11/00* (2013.01); *G11C 16/0483* (2013.01); *G11C 2207/2254* (2013.01)

(58) Field of Classification Search
CPC .................. G11C 16/0483; G11C 7/04; G11C 2207/2254; G11C 11/00
USPC ...................................... 365/185.17
See application file for complete search history.

(56) References Cited

U.S. PATENT DOCUMENTS

| | | | |
|---|---|---|---|
| 9,324,410 B2* | 4/2016 | Arai | G11C 7/1057 |
| 9,368,234 B2* | 6/2016 | Kang | G11C 29/50008 |
| 9,520,164 B1 | 12/2016 | Yamamoto et al. | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |
| 2013/0015880 A1 | 1/2013 | Haraguchi | |
| 2018/0158495 A1 | 6/2018 | Jeon et al. | |

\* cited by examiner

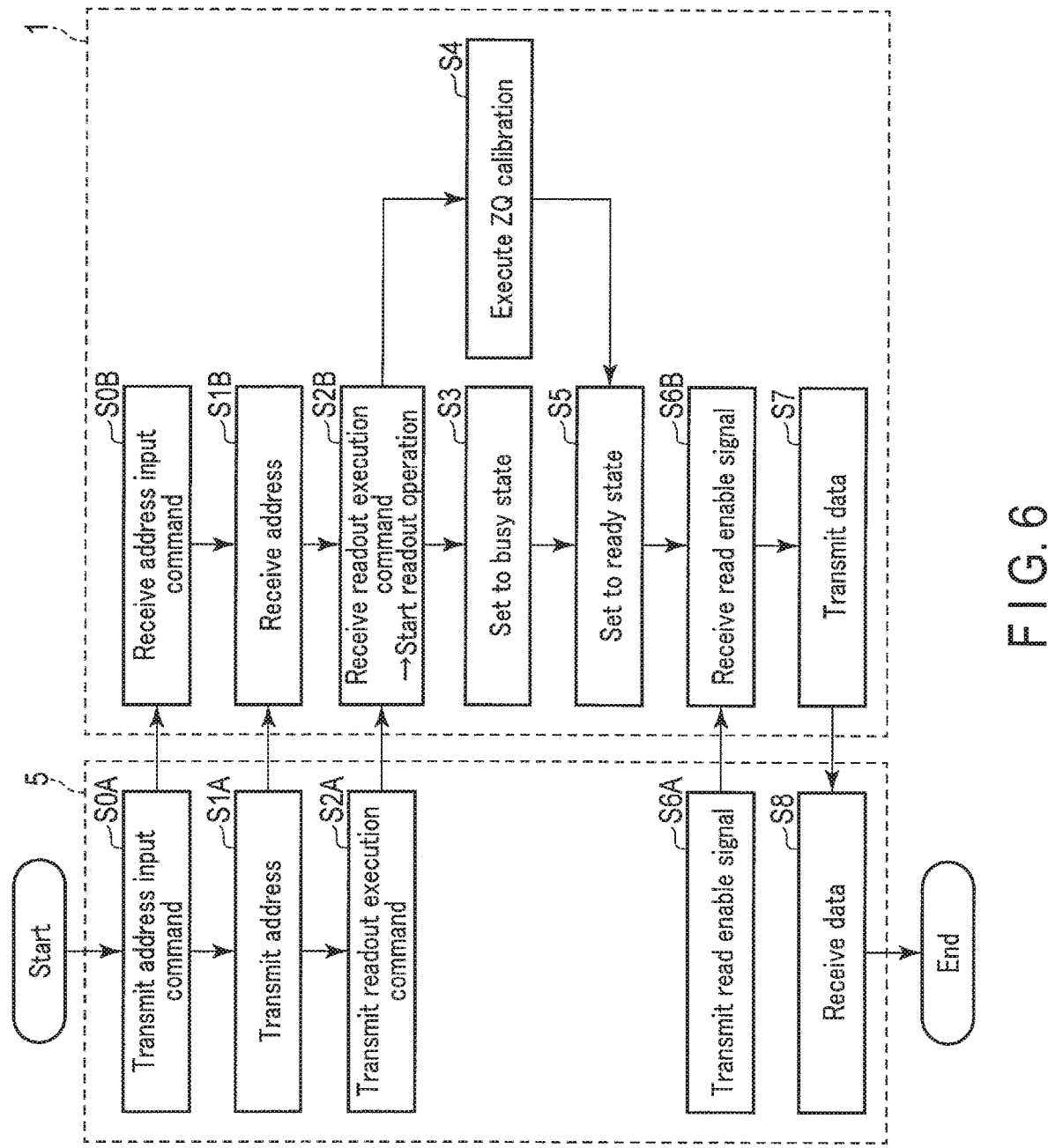
F I G. 6

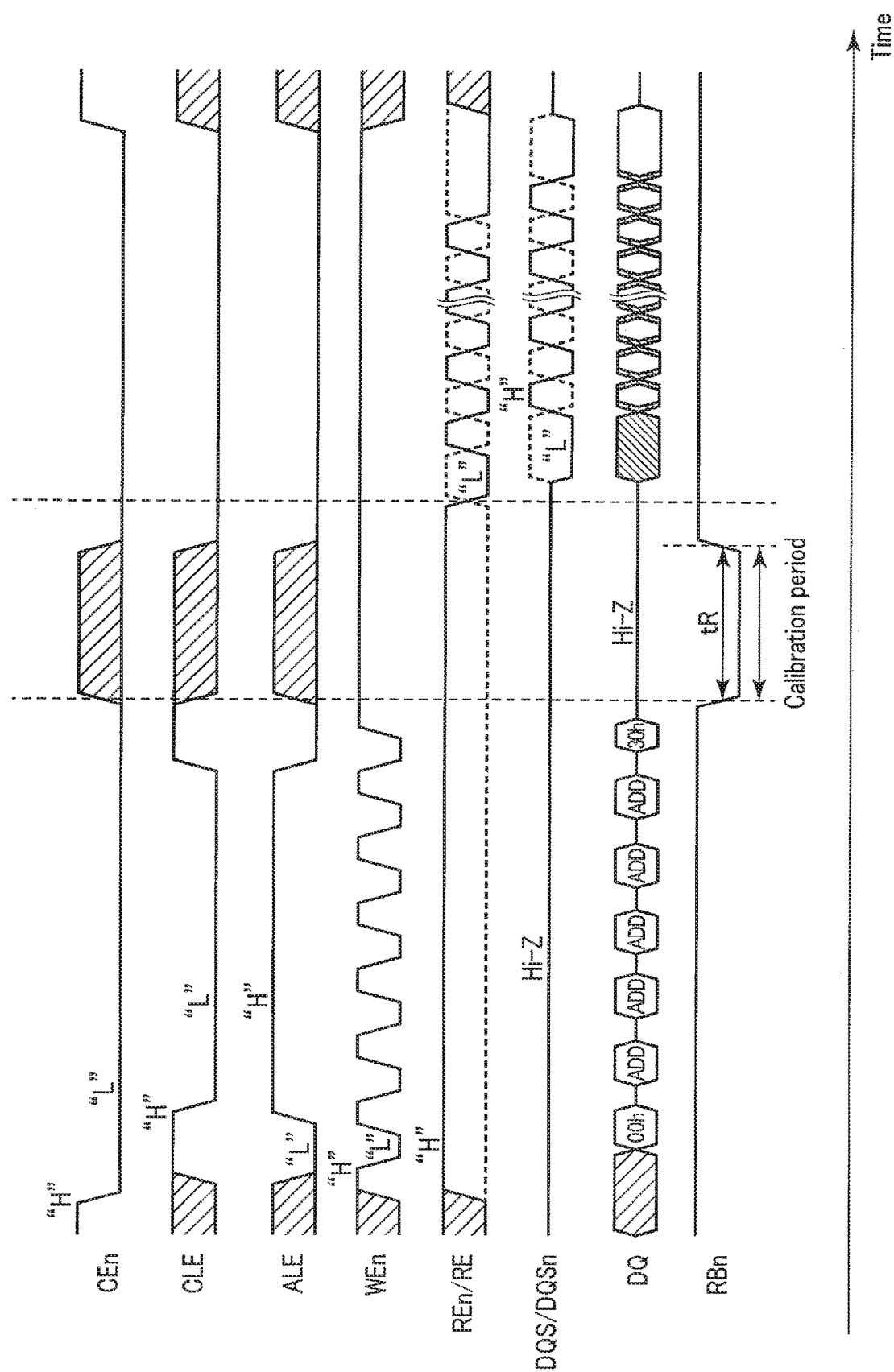
F I G. 7

US 10,643,703 B2

SEMICONDUCTOR MEMORY DEVICE HAVING A SEMICONDUCTOR CHIP INCLUDING A MEMORY CELL AND A RESISTANCE ELEMENT

CROSS-REFERENCE TO RELATED APPLICATIONS

This application is a Continuation application of U.S. application Ser. No. 15/699,847, filed Sep. 8, 2017, and issued as U.S. Pat. No. 10,283,201 on May 7, 2019, which is based upon and claims the benefit of priority from Japanese Patent Application No. 2017-060033, filed Mar. 24, 2017, the entire contents of both of which are incorporated herein by reference.

FIELD

Embodiments described herein relate generally to a semiconductor device.

BACKGROUND

A semiconductor device such as a flash memory is used for various electronic devices.

BRIEF DESCRIPTION OF THE DRAWINGS

FIG. 6 is a flowchart showing an operation example of the semiconductor device of the first embodiment.

FIG. 7 is a timing chart showing the operation example of the semiconductor device of the first embodiment.

DETAILED DESCRIPTION

Figure 1:
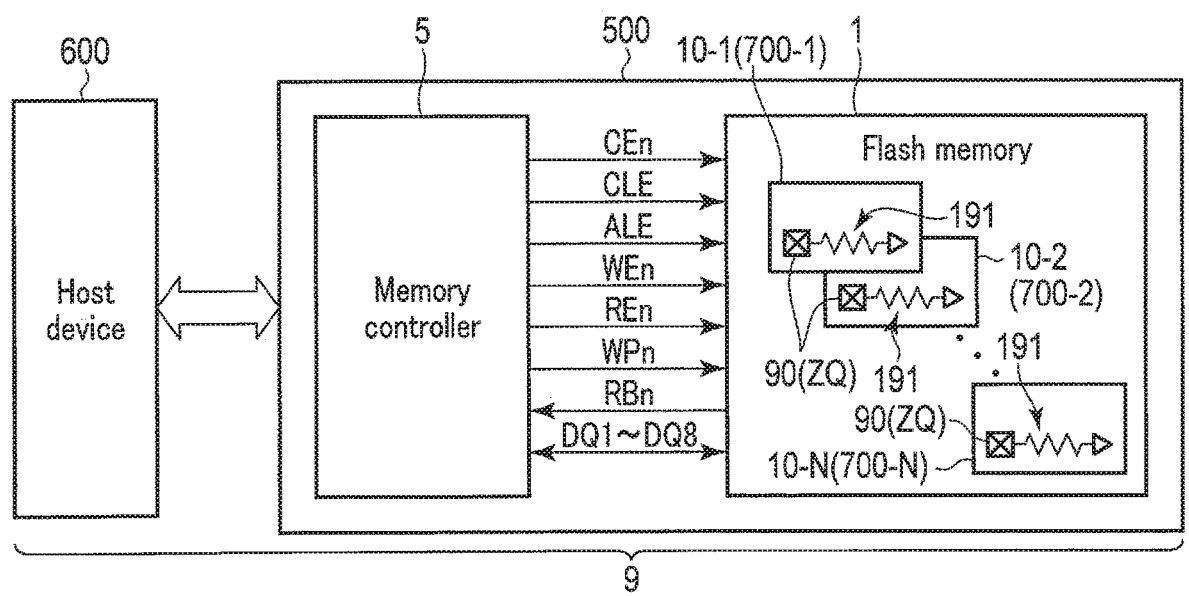
FIG. 1 is a diagram showing a configuration example of a system including a semiconductor device of an embodiment.

In general, according to one embodiment, a semiconductor device includes: a first memory cell provided in a first semiconductor chip; a first output buffer circuit configured to output data of the first memory cell outside, the first output buffer circuit provided in the first semiconductor chip; a first calibration control circuit configured to calibrate an impedance of the first output buffer circuit, a first terminal connected to the first calibration control circuit, the first calibration control circuit provided in the first semiconductor chip; and a first resistance element connected to the first terminal, the first resistance element provided in the first semiconductor chip.

[Embodiments]

Semiconductor devices of embodiments will be explained with reference to FIG. 1 to FIG. 10.

Hereinafter, the present embodiments will be explained in detail with reference to the accompanying drawings. In the explanation below, elements having the same functions and configurations will be denoted by the same reference symbols.

In the following respective embodiments, when the reference numerals (for example, a word line WL, a bit line BL, various voltages and signals, or the like) are accompanied by numbers or alphabetical characters at the end of the reference numerals for differentiation, such numbers or alphabetical characters may be omitted when differentiation is not needed in the description.

(1) First Embodiment

A semiconductor device of a first embodiment will be explained using FIG. 1 to FIG. 7. Hereinafter, a memory device is illustrated to explain the semiconductor device of the embodiment.

(a) Configuration Example

A configuration example of the memory device of the first embodiment will be explained using FIG. 1 to FIG. 5.

(a-1) Entire Configuration

FIG. 1 is a block diagram showing a configuration example of a memory system including the memory device of the present embodiment.

As shown in FIG. 1, a memory system 9 includes a storage device 500 and a host device 600.

The host device 600 is coupled to the storage device 500 through, for example, a connector, a cable, wireless communication, or the internet. The host device 600 is a device selected from, for example, a digital camera, a smart phone, a future phone, a game equipment, a server, a PC, and a processor.

The host device 600 requests the storage device 500 to write data, read data, and erase data.

The storage device 500 includes a controller (memory controller) 5 and a memory device (semiconductor memory) 1.

The controller 5 causes the memory device 1 to execute an operation in response to the request from the host device 600.

The controller 5 includes, for example, a processor (CPU), a DRAM, a SRAM, and an ECC circuit. The CPU controls the entire operation of the controller 5. The DRAM and SRAM temporarily retain data, a program (software/firmware), and management information (a management table) of a storage device/memory device. The ECC circuit detects an error within data read from the memory device 1 and corrects the detected error.

The memory device 1 stores data. The memory device 1 writes data, reads out data, and erases data based on a command from the controller 5 (a request from the host device 600).

The memory device 1 is, for example, a NAND type flash memory. The storage device 500 (or the memory system 9) that includes a flash memory 1 is a device selected from, for example, a memory card (for example, an SD™ card, an eMMC™), a USB memory, or a Solid State Drive (SSD).

The flash memory 1 includes a plurality of memory circuits 10. The memory circuits 10 function as a core circuit for storing data.

As a control signal based on a NAND interface standard between a NAND type flash memory 1 and the controller 5, for example, a chip enable signal CEn, a command latch enable signal CLE, an address latch enable signal ALE, a write enable signal WEn, a read enable signal REn, and a write protect signal WPn are used.

The signal CEn is a signal for setting a certain memory circuit (chip) among a plurality of memory circuits within the flash memory 1 to an enable state.

The signal CLE and the signal ALE are signals respectively notifying that signals on data lines DQ (DQ1 to DQ8) are command and address signals.

The signal WEn and the signal REn are signals respectively instructing, for example, input and output of the signals through the data lines DQ.

The signal WPn is, for example, a signal for setting the flash memory 1 to a protection state when the power source of the memory system is turned ON/OFF.

Based on the operation state of the flash memory 1, the signal level of a ready/busy signal RBn is controlled. The ready/busy signal RBn is transmitted from the flash memory 1 to the controller 5. The signal RBn is a signal for notifying the controller 5 whether the flash memory 1 is in a ready state (a state in which a command from the controller 5 can be received) or in a busy state (a state in which a command from the controller 5 cannot be received).

For example, the signal RBn is set to level "L" (a busy state) when the flash memory 1 is in operation, such as reading data, and is set to level "H" (a ready state) when the operation is ended.

In the flash memory 1 of the present embodiment, for example, each of the memory circuits 10 includes a resistance element 191 for the calibration of the data lines DQ. The resistance element 191 is, for example, connected to a terminal 90.

A structure example of the flash memory of the present embodiment will be explained using FIG. 2.

Figure 2:
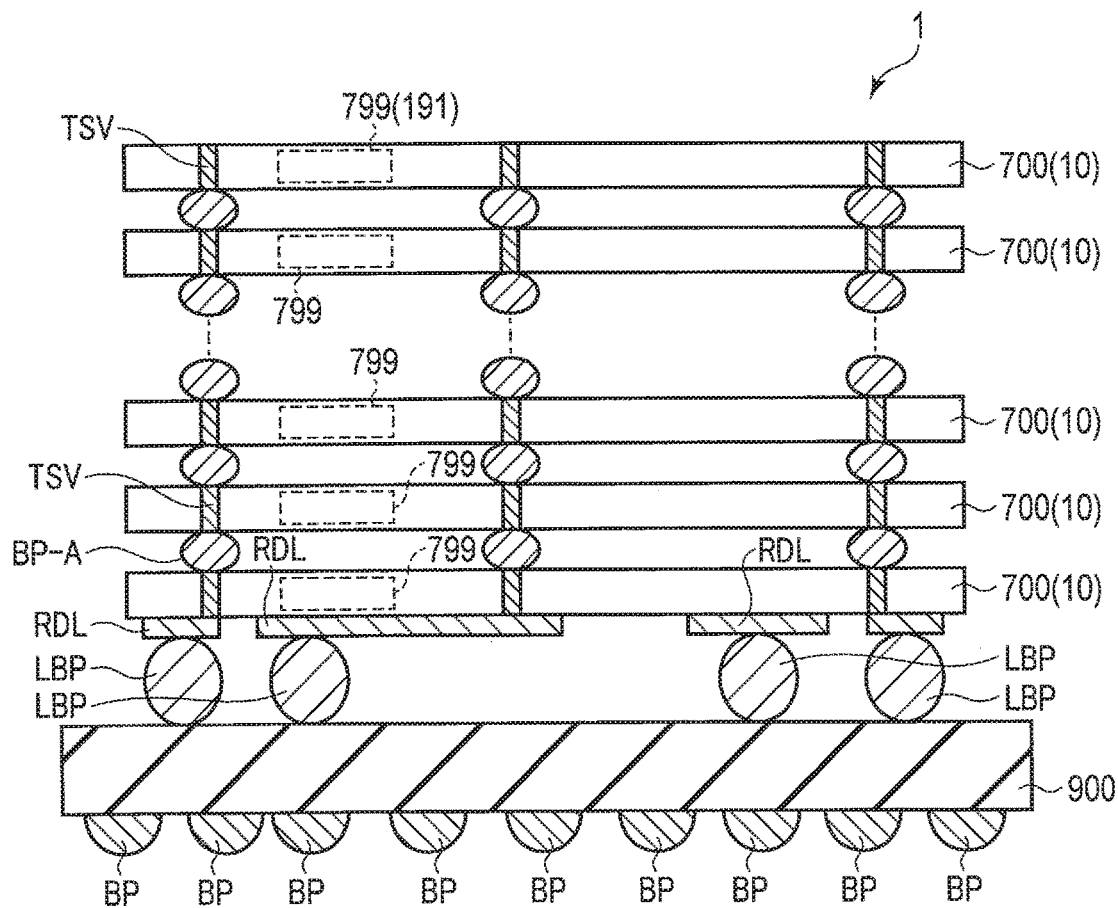
FIG. 2 is a schematic cross-sectional view showing a structure example of the semiconductor device.

FIG. 2 is a cross-sectional view for explaining the structure example of a mounting state of the flash memory of the present embodiment. In FIG. 2, for clarification, main constituent elements are extracted and shown. The flash memory of the present embodiment includes various connection terminals (for example, a bump and a pad) and various interconnects (for example, an internal interconnect and a re-distribution layer) that are not shown in FIG. 2.

The flash memory 1 of the present embodiment has, for example, a package structure referred to as a Ball Grid Array (BGA).

As shown in FIG. 2, the flash memory 1 of the present embodiment includes a plurality of semiconductor chips 700 inside a package (mold material).

In the flash memory 1 including the chips 700, one memory circuit 10 is provided inside one semiconductor chip 700. Hereinafter, the semiconductor chip 700 of the memory circuit 10 will be referred to as a memory chip 700.

A plurality of memory chips 700 are stacked on a substrate (a package substrate) 900.

A plurality of large bumps LBP are provided on an upper surface of the substrate 900.

A plurality of bumps BP are provided on a bottom surface (a lower surface) of the substrate 900. The bump BP and the large bump LBP are electrically connected through an interconnect (not shown) provided inside the substrate 900. The bottom surface of the substrate 900 is a surface opposite to the surface where the chips 700 are provided.

The bump BP is used for input and output between a circuit inside the chip 700 on the substrate 900 and other devices, or is used for supplying a power supply voltage to the flash memory 1.

A plurality of memory chips 700 are stacked on the large bump LBP.

Each of the memory chips 700 includes a plurality of connection terminals (for example, electrodes and pads). The memory chip 700, for example, includes an electrode TSV as the connection terminal. The electrode TSV has a Through Silicon Via structure. The electrode TSV penetrates through the memory chip 700. The upper part of the electrode TSV is exposed on the upper surface of the memory chip 700, and the lower part of the electrode TSV is exposed on the lower surface of the memory chip 700. In each of the memory chips 700, the electrode TSV electrically connects a certain memory chip 700 with another memory chip 700 on the upper layer and/or the lower layer.

A bump BP-A is provided between the memory chips 700. The bump BP-A is electrically connected to the electrode TSV (or a pad).

The memory chips 700 are stacked so that chips are electrically connected through the electrode TSV and the bump BP-A.

The memory chip 700 does not have to include the electrode TSV. In such case, the connection terminals provided on the upper surface and the lower surface (bottom surface) of the memory chip 700 are connected to the bump BP-A (or a bonding wire). In this manner, the laminated memory chips 700 are electrically connected.

In FIG. 2, only the bumps BP and BP-A, and the large bump LBP are shown.

However, on the substrate 900, a bump, a large bump, and a micro bump that are not shown are provided for other input and output signals, and the like.

A re-distribution layer RDL is provided on, for example, a lower surface (a surface facing the substrate 900) of the memory chip 700 at the lowest layer among the memory chips 700.

The re-distribution layer RDL electrically connects the large bump LBP on the substrate 900 with the connection terminal (the pad or TSV) of the memory chip. In this manner, the memory chip 700 is electrically connected to the interconnect of the substrate 900.

The memory chip 700, for example, includes a resistance element region 799. At least one resistance element 191 is provided inside the resistance element region 799.

An interface circuit for transmission/reception of data between the controller 5 and the flash memory 1 may also be provided on the substrate 900 as a semiconductor chip different from the memory chip.

(a-2) Internal Configuration of Memory Device

An internal configuration of the memory device (for example, the flash memory) of the present embodiment will be explained using FIGS. 3 to 5.

Figure 3:
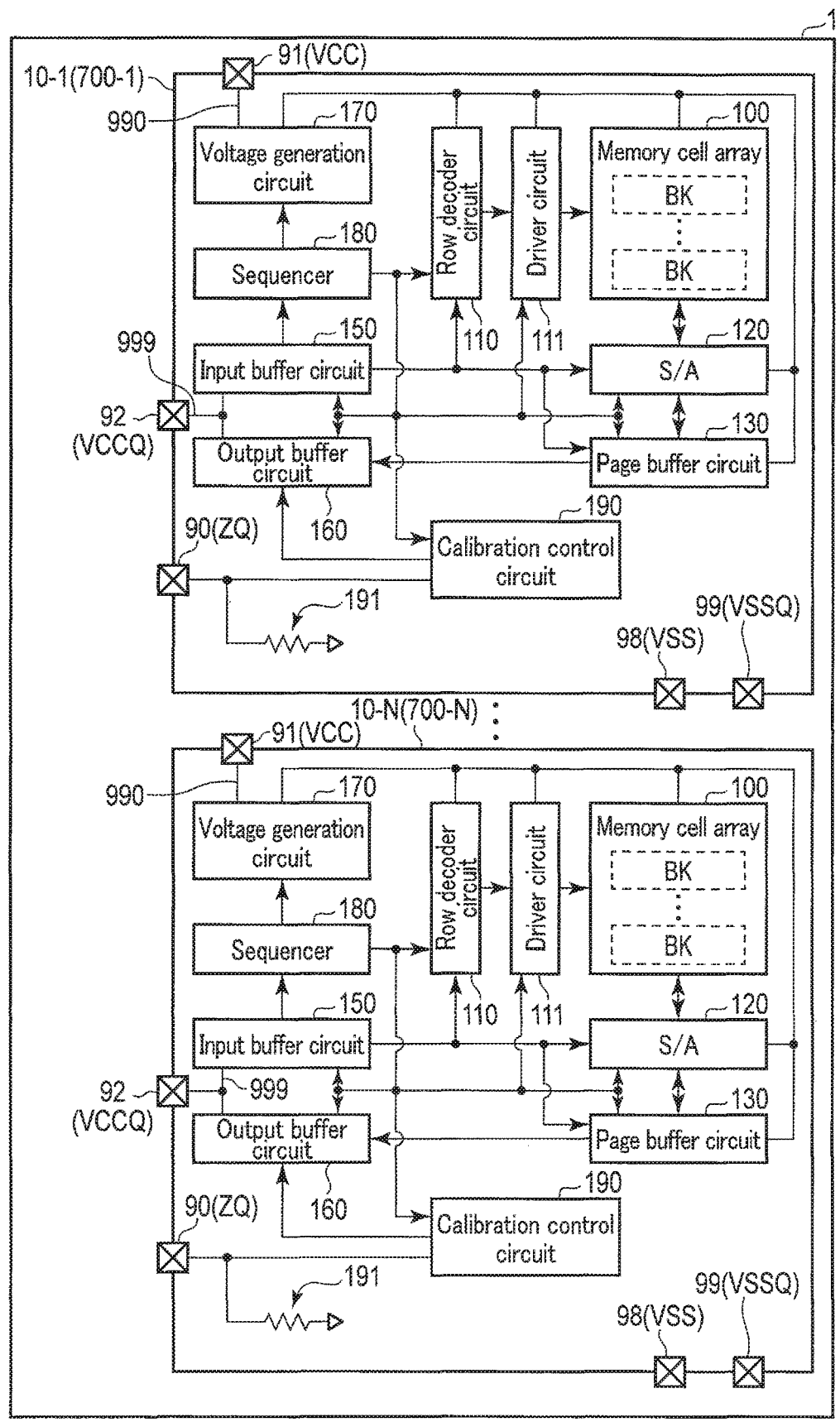
FIG. 3 is a diagram showing a configuration example of a semiconductor device of a first embodiment.

FIG. 3 shows an example of the internal configuration of the flash memory of the present embodiment.

As shown in FIG. 3, in the flash memory 1 of the present embodiment, the memory circuits 10 (10-1 to 10-N) have substantially the same internal configuration.

The memory circuits 10 include at least a memory cell array 100, a row decoder circuit 110, a driver circuit 111, a sense amplifier circuit 120, a page buffer circuit 130, an input buffer circuit 150, an output buffer circuit 160, a voltage generation circuit 170, a sequencer 180, and a calibration control circuit 190.

The memory cell array 100 stores data from the controller 5. The memory cell array 100 includes a plurality of blocks BK (for example, four blocks).

A block BK is, for example, a unit of data erasure. An erasing operation of the flash memory of the present embodiment is executed in units of blocks. However, the flash memory of the present embodiment is not limited to performing the erasing operation in units of blocks, and may also perform the erasing operation in units smaller than the block BK. The erasing operation of the flash memory is described, for example, in "Nonvolatile semiconductor memory device", which was filed under U.S. patent application Ser. No. 13/235,389 on Sep. 18, 2011, and in "Nonvolatile semiconductor storage device", which was filed under U.S. patent application Ser. No. 12/694,690 on Jan. 27, 2010. The entire contents of these applications are incorporated herein by reference.

Here, the internal configuration of the memory cell array 100 of the flash memory 1 will be explained using FIG. 4 and FIG. 5.

Figure 4:
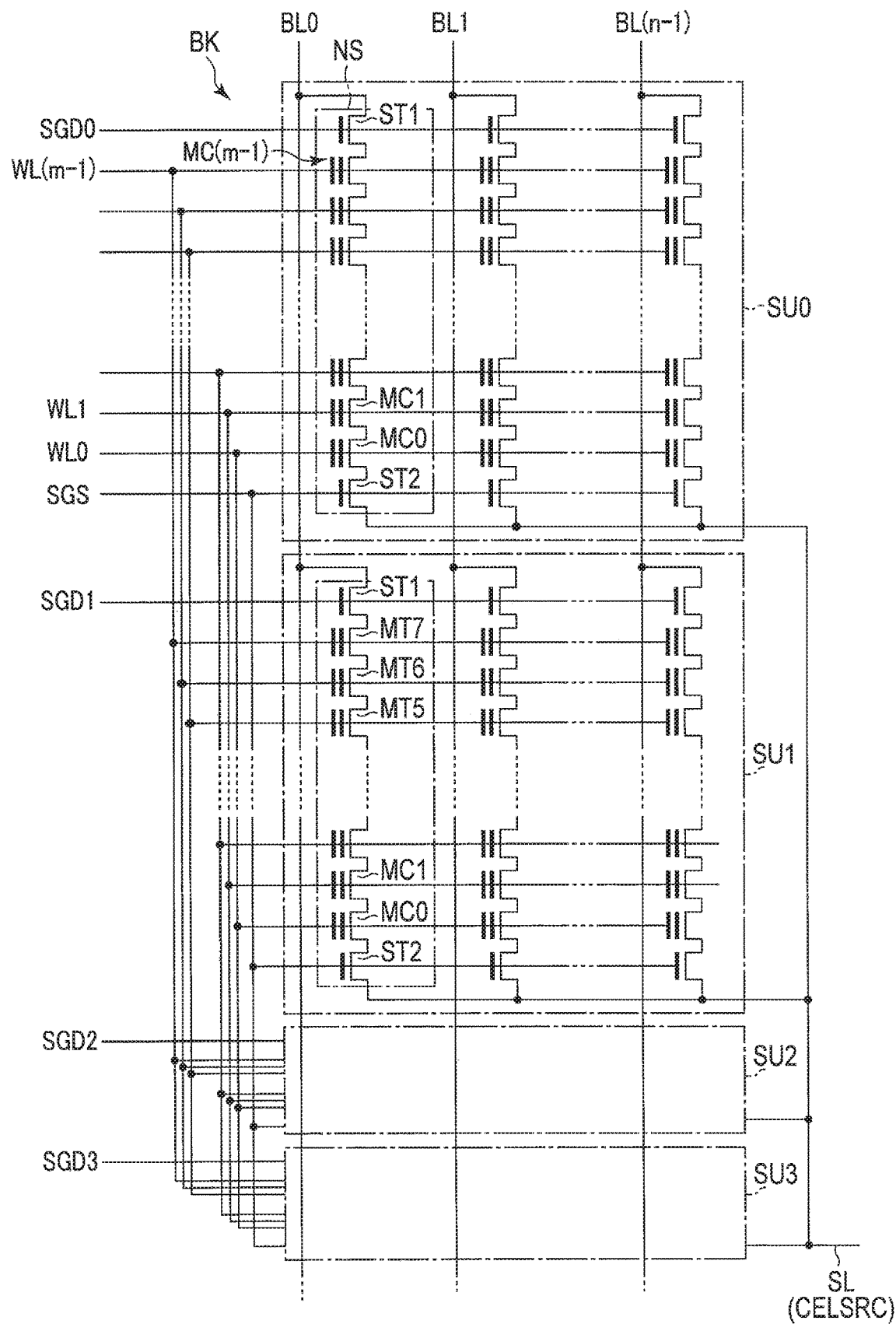
FIG. 4 is an equivalent circuit diagram showing an example of an internal configuration of a memory cell array.

FIG. 4 is an equivalent circuit diagram showing an example of an internal configuration of one block in the memory cell array.

As shown in FIG. 4, a block BK includes a plurality of (here, four) string units SU (SU0 to SU3). Each of the string units SU includes a plurality of NAND strings NS.

The NAND strings NS include a plurality of memory cells MC (MC0 to MC(m-1)) and select transistors ST1 and ST2. (m-1) is a natural number not less than 1.

The memory cells (memory cell transistors) MC include a control gate and a charge storage layer (a memory film). Inside the NAND strings NS, a plurality of memory cells MC are connected in series between the select transistors ST1 and ST2. Of the memory cells connected in series, one end (source/drain) of the memory cell MC(m-1) is connected to one end (source/drain) of the select transistor ST1. One end (source/drain) of the memory cell MC0 is connected to one end of the select transistor ST2.

A plurality of select gate lines SGD0 to SGD3 are connected respectively to a gate of the select transistor ST1 of the string units SU0 to SU3. The select gate lines SGD are provided independently for each of the string units SU0 to SU3.

A select gate line SGS is connected in common to a gate of the select transistor ST2 among a plurality of string units SU.

For example, one select gate line SGS is shared between four string units SU.

Depending on the internal configuration of the block BK, two source side select gate lines SGS may be provided inside one block BK. In this case, one select gate line SGS may be provided for two string units SU.

Furthermore, four source side select gate lines SGS may be provided inside one block BK. In this case, select gate lines that are independent of each other are provided for each string unit.

At the memory cells MC to MC(m-1) of a plurality of string units SU inside the block BK, word lines WL0 to WL(m-1) are connected in common to a control gate of a memory cell MC given the same number as the number of the word line.

In the memory cell array 100, among the NAND strings NS arranged in a matrix pattern, other end (source/drain) of each select transistor ST1 of the NAND strings NS in the same column is connected in common to one of the bit lines BL (BL0 to BL(n-1)) of a plurality of bit lines. The bit lines BL, for example, connect the NAND strings NS among a plurality of blocks BK in common. (n-1) is a natural number not less than 1.

Other end (source/drain) of the select transistor ST2 is connected to a source line SL.

Data reading and data writing are performed at a time for a plurality of memory cells MC that are connected in common to a word line selected among a plurality of word lines WL at a selected string unit SU in a selected block BK. The unit of data reading or data writing is referred to as page PG.

Figure 5:
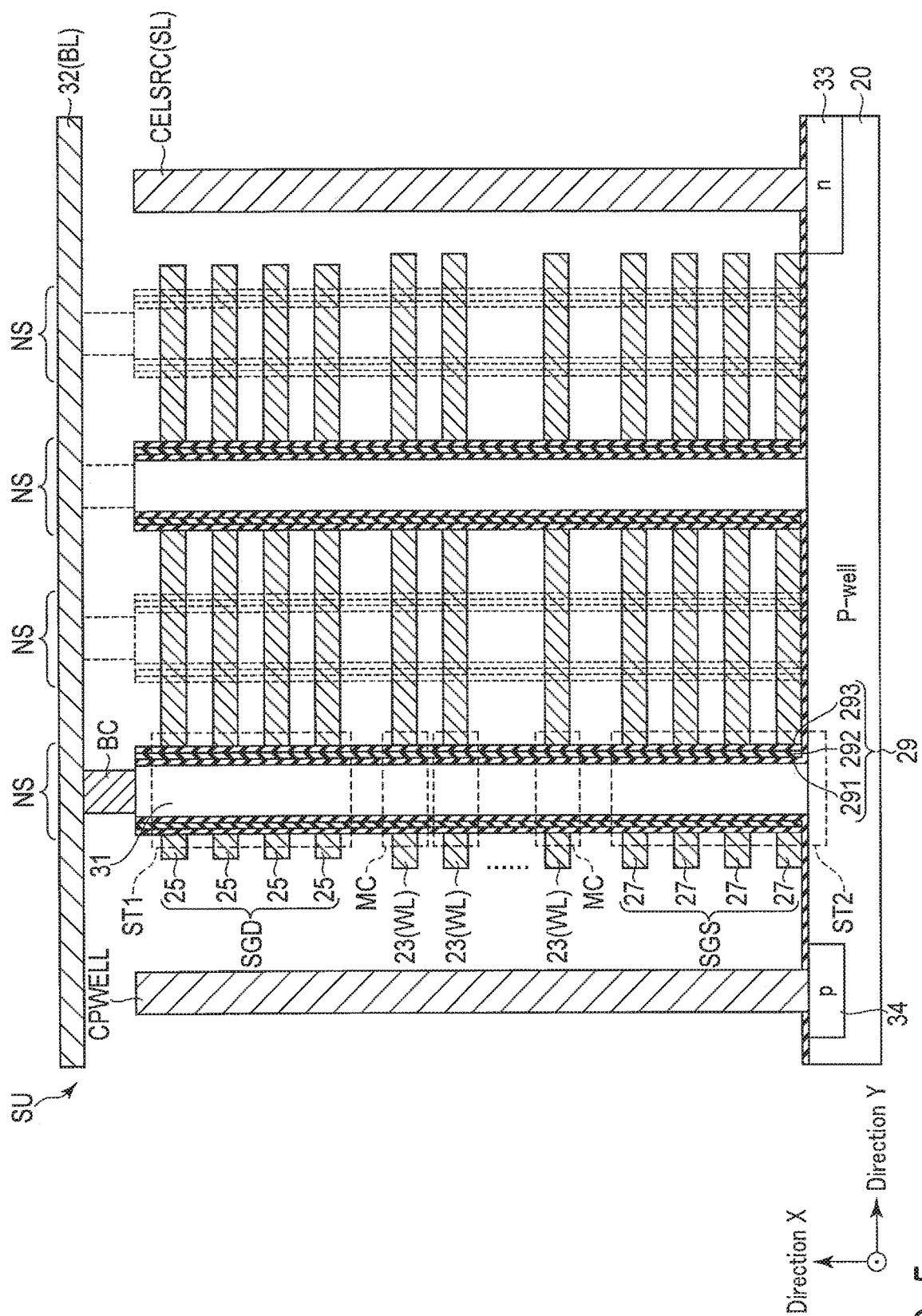
FIG. 5 is a schematic cross-sectional view showing an example of the internal configuration of the memory cell array.

FIG. 5 shows a cross-sectional structure of a string unit. In FIG. 5, members positioned in a depth direction (or a forward direction) in a vertical direction with respect to the plane of the paper are shown in dotted lines. In FIG. 5, to clarify the drawing, an interlayer insulating film that covers constituent members of the string unit will not be illustrated.

As shown in FIG. 5, a p-well region 20 is provided in a semiconductor region (for example, an Si substrate) in the cross-sectional structure of the memory cell array 100.

A semiconductor pillar 31 is provided on the p-well region 20. The semiconductor pillar 31 is extended approximately vertically against the surface of the p-well region 20 (the surface of the Si substrate). The semiconductor pillar 31 is a region in which a channel of each transistor is formed when the memory cell MC and the select transistors ST1 and ST2 are in operation. Therefore, a current flows in the semiconductor pillar 31.

A memory film 29 is provided on the side surface of the semiconductor pillar 31. The memory film 29 includes, from the semiconductor pillar 31 side, a gate insulating film 291, a charge storage layer (an insulating film) 292, and a block insulating film 293.

A plurality of conductive layers 23, 25, and 27 are stacked on the well region 20. The interlayer insulating film (not shown) is provided between the conductive layers 23, 25, and 27. Each of the conductive layers 23, 25, and 27 is provided on the side surface of the semiconductor pillar 31 via the memory film 29.

A plurality of (four, in the present example) conductive layers 25 are connected to the same drain side select gate line SGD at each of the NAND strings NS. A drain side select transistor ST1 is provided in an intersection region of the conductive layer 25 and the semiconductor pillar 31.

A plurality of (four, in the present example) conductive layers 27 are connected to the same source side select gate line SGS. A source side select transistor ST2 is provided in an intersection region of the conductive layer 27 and the semiconductor pillar 31.

Each of the conductive layers 23 is connected to a different word line WL. The memory cell MC is provided in an intersection region of the conductive layer 23 and the semiconductor pillar 31.

The memory cell MC stores data by storing electric charges in the charge storage layer 292 facing the conductive layer 23.

A bit line contact BC is provided on the upper end of the semiconductor pillar 31. A conductive layer (bit line) 32 is provided on the bit line contact BC.

An $n^+$-type diffusion layer 33 and a $p^+$-type diffusion layer 34 are provided in the surface region of the well region 20.

A source line contact CELSRC is provided on the diffusion layer 33. The source line contact CELSRC is connected to the source line SL. The gate insulating film 291, for example, covers the surface of the well region 20. The conductive layer 27 and the gate insulating film 291 extend to the proximity of the diffusion layer 33. Therefore, when the select transistor ST2 becomes an ON state, the channel of the select transistor ST2 electrically connects the memory cell MC and the diffusion layer 33.

A well contact CPWELL is provided on the diffusion layer 34. The well contact CPWELL is connected to a well interconnect (not shown). By applying a voltage to the well contact CPWELL, it is possible to apply a potential to the well region 20 and the semiconductor pillar 31.

For the structure, operation, and manufacturing method of a three-dimensional memory cell array in the present embodiment, for example, configurations described in U.S. patent application Ser. No. 12/407,403 filed on Mar. 19, 2009 and entitled "THREE-DIMENSIONALLY STACKED NONVOLATILE SEMICONDUCTOR MEMORY," U.S. patent application Ser. No. 12/406,524 filed on Mar. 18, 2009 and entitled "THREE-DIMENSIONALLY STACKED NONVOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF" are applied.

The memory cell array 100 may have a structure in which a plurality of memory cells MC are arranged two-dimensionally (for example, inside an X-Y plane).

Again, in FIG. 3, other circuits (peripheral circuits) controlling the operation of the memory cell array 100 will be explained.

The row decoder circuit 110 selects a block from a plurality of blocks BK based on an address ADD from the controller 5, and selects a row in the selected block BK.

The driver circuit 111 supplies a voltage to the selected block BK.

When data is read, the sense amplifier circuit 120 senses the potential or the current of the bit line BL in order to determine data read from the memory cell array 100. The sense amplifier circuit 120 performs calculation processing using a sense result. The sense amplifier circuit 120 outputs data obtained from the sense result and the calculation result to the page buffer circuit 130.

When data is written, the sense amplifier circuit 120 transfers write data to the memory cell array 100. The sense amplifier circuit 120 is capable of controlling the potential of the bit line BL.

The page buffer circuit 130 temporarily retains the read data from the sense amplifier circuit 120. The page buffer circuit 130 temporarily retains the write data from the controller 5.

The voltage generation circuit 170 generates various voltages used for read operation, write operation, and erasing operation using a voltage VCC. The voltage generation circuit 170 supplies the generated voltage to the row decoder circuit 110, the driver circuit 111, and the sense amplifier circuit 120, etc. The voltage VCC is, for example, supplied from the outside to the inside of the flash memory 1 through an interconnect 990 and a terminal 91.

The input buffer circuit 150 receives data and a signal on the data line DQ. Various signals are supplied into the memory circuit 10 through the input buffer circuit 150.

The output buffer circuit 160 outputs the data and the signal on the data line DQ. The data is supplied to the controller 5 through the output buffer circuit 160.

The input buffer circuit 150 and the output buffer circuit 160 operate using a voltage VCCQ. The voltage VCCQ is supplied to each of the circuits 150 and 160 from the voltage VCC through an independent interconnect 999. The voltage VCCQ is, for example, supplied from the outside to the inside of the flash memory 1 through the interconnect 999 and a terminal 92.

A ground voltage VSSQ is, for example, supplied to the input buffer circuit 150 and the output buffer circuit 160 through a terminal 99. A ground voltage VSS is supplied to circuits other than the buffer circuits 150 and 160 through a terminal 98. A power supply system (interconnect) that belongs to the terminal 98 and a power supply system that belongs to the terminal 99 are electrically separated. The power supply system of terminal 98 may be electrically connected to the power supply system of the terminal 98.

A command, an address, and various control signals are transferred between the memory circuits 10 and the controller 5.

The sequencer (for example, referred also to as a control circuit, an internal control circuit, or a state machine) 180 controls the entire operation of the memory circuits 10 based on the command and the various control signals.

The calibration control circuit 190 controls an impedance of the output buffer circuit 160 (for example, an ON resistance of a transistor inside the circuit 160).

The calibration control circuit 190 uses at least one resistance element (hereinafter referred to also as a calibration resistance element) 191 in order to calibrate the impedance. The calibration control circuit 190 is electrically connected to the calibration resistance element 191. The calibration resistance element 191 is connected to a terminal (hereinafter referred to also as a ZQ terminal) 90.

The resistance element 191 does not have to be connected to the ZQ terminal 90 as long as it is connected to the calibration control circuit 190. In this case, the ZQ terminal 90 does not have to be provided on the memory chip 700.

As shown in FIG. 3 (and FIG. 1), in the flash memory 1 of the present embodiment, each of the memory chips 700 (memory circuits 10) includes the calibration resistance element 191.

As will be mentioned later on, in the present embodiment, when the flash memory 1 receives the read command, the calibration control circuit 190 executes the calibration operation for calibrating the impedance. The calibration operation is executed during a period in which the flash memory 1 is set to a busy state due to the read operation.

The flash memory 1 of the present embodiment is also capable of executing the calibration operation performed by the calibration control circuit 190 by a command (for example, a ZQ calibration command) from the controller 5.

(b) Operation Example

An operation example of the memory device of the present embodiment will be explained using FIG. 6 and FIG. 7.

FIG. 6 shows a flowchart of the operation example of the memory device of the present embodiment. FIG. 7 shows a timing chart of the operation example of the memory device of the present embodiment.

As shown in FIG. 6, the controller 5 issues a command for a read operation to the flash memory 1 (step S0A). The controller 5 transmits an address input command ("00h") to the flash memory 1. The address input command is output on the data line DQ.

As shown in FIG. 7, when the controller 5 commands the flash memory 1 to perform an operation, the controller 5 sets the signal level of the chip enable signal CEn of a memory chip (memory circuit) that is to be an operation target to level "L". The signal level of the chip enable signal CEn of a memory chip that is not the operation target is set to level "H".

The controller 5 sets the signal level of the command latch enable signal CLE to level "H". The controller 5 sets the signal level of the address latch enable signal ALE to level "L".

In this manner, the flash memory 1 is notified that the signal on the data line DQ is a command.

The controller 5 toggles a write enable signal/WE. The controller 5 sets the signal level of a read enable signal/RE to level "H".

In this manner, the flash memory 1 becomes capable of latching the signal on the data line DQ.

The controller 5 sets the signal level of a data strobe signal DQS to a high impedance state (unstable state) Hi-Z.

The flash memory 1 sets a ready/busy signal to level "H".

The flash memory 1 receives the address input command (step S0B). The flash memory 1 latches the address input command based on the level "H" signal CLE.

In the flash memory 1, a memory chip (hereinafter referred to as a selected memory chip) 10 selected among a plurality of memory chips 10 based on the chip enable signal CEn latches the command.

The controller 5 transmits an address (hereinafter referred to as a selected address) that is the target of reading data to the flash memory 1 (step S1A). The selected address ADD is output on the data line DQ.

After transmitting the command, the controller 5, for example, changes the signal level of the signal CLE from level "H" to level "L". The controller 5 changes the signal level of the signal ALE from level "L" to level "H". In this manner, the flash memory 1 is notified that the signal output on the data line DQ is an address.

The flash memory 1 receives the selected address ADD (step S1B). In the flash memory 1, for example, the selected memory chip 700 latches the selected address ADD based on the level "H" signal ALE.

In the flash memory 1, a memory chip 700 is selected among a plurality of memory chips 700 based on the chip enable signal CEn. In the selected memory chip 700, the row decoder circuit 110 decodes the address. Based on the decode result of the address, a word line and a bit line corresponding to the address are activated.

The controller 5 transmits a read execution command (for example, a command "30h") to the flash memory 1 (step S2A).

After transmitting the selected address, the controller 5 changes the signal level of the signal ALE from level "H" to level "L". The controller 5 changes the signal level of the signal CLE from level "L" to level "H". In this manner, the flash memory 1 is notified that the signal output on the data line DQ is a command.

The flash memory 1 receives the read execution command (step S2B).

In the flash memory 1, in the selected memory chip 700, the memory circuit 10 latches the read execution command based on the level "H" signal CLE.

In this manner, the flash memory 1 starts the read operation.

After the command is transmitted, the controller 5, for example, sets the signal level of the write enable signal/WE to level "H".

In the flash memory 1, in the selected memory chip 700, the memory circuit 10 sets the ready/busy signal RBn to a busy state (step S3). The sequencer 180 in the selected memory chip 700 changes the signal level of the ready/busy signal RBn from level "H" to level "L".

In the selected memory chip 700, the memory circuit 10 executes an internal operation for reading data. During a period in which the signal level of the ready/busy signal RBn is level "L", the input buffer circuit 150 and the output buffer circuit 160 do not operate.

The voltage generation circuit 170 generates various voltages that are used for the read operation based on the latched command. The voltage generation circuit 170 supplies the generated voltage to the row decoder circuit 110, the driver circuit 111, and the sense amplifier circuit 120, etc.

The row decoder circuit 110 decodes the latched selected address ADD. Based on the decode result, the driver circuit 111 supplies the read voltage and the unselected voltage to the selected word line corresponding to the selected address ADD and the unselected word line. In a string unit corresponding to the selected address ADD, for example, the selected drain side select gate line SGD and source side select gate line SGS are activated. The select transistors ST1 and ST2 of the selected select gate lines SGD and SGS are turned ON.

The sense amplifier circuit 120 charges the bit line BL. The sense amplifier circuit 120 senses a current generated in the bit line BL, or senses the potential variation in the bit line.

Data is read from the memory cell based on the sense result by the sense amplifier circuit 120. The data is temporarily retained in the page buffer circuit 130.

In the present embodiment, the calibration operation is started using the command for read operation as a trigger (step S4).

In parallel with a period tR in which the ready/busy signal RBn is set to a busy state (level "L"), the calibration control circuit 190 executes a calibration operation with respect to the output buffer circuit 160.

The calibration control circuit 190 controls the magnitude of the impedance of the output buffer circuit 160 (for example, an ON resistance of the transistor) by using the calibration resistance element 191. For example, for a plurality of transistors inside the output buffer circuit 160, the number of transistors to be driven upon data transfer is controlled.

As a result, the impedance of the output buffer circuit 160 is calibrated so that it satisfies the permissible value which is based on the specification/standard of the flash memory 1 in a calibration period which overlaps the period tR.

In the present embodiment, each of the memory chips 700 (memory circuits) includes the calibration resistance element 191. In the flash memory of the present embodiment, this allows the selected memory chip 700 to execute the calibration operation for the output buffer circuit 160 inside the selected memory chip 700 non-synchronously with the other memory chips 700 without being influenced by the other memory chips.

The calibration operation is, for example, ended before ending the read operation inside the selected memory chip 700 (before data is supplied to the page buffer circuit 130).

The sequencer 180 sets the ready/busy signal to a ready state after the data of the selected address is retained in the page buffer circuit 130 (step S5).

The sequencer 180 changes the signal level of the ready/busy signal RBn from level "L" to level "H".

The controller 5 transmits the read enable signal to the flash memory 1 (step S6A). The controller 5 toggles the read enable signal REn.

The flash memory 1 receives the toggled read enable signal REn (step S6B).

The flash memory 1 transmits the data to the controller 5 based on the read enable signal REn (step S7).

The data strobe signal DQS is toggled in synchronized with the toggled read enable signal REn. The output buffer circuit 160 outputs the data on the data line DQ.

The controller 5 receives the data (step S8). The controller 5 retrieves the data on the data lines DQ at a timing that corresponds to the data strobe signal DQS.

In this manner, the controller 5 acquires the data read from the flash memory 1.

In the above manner, the read operation of the flash memory in the memory system of the present embodiment is completed.

The write operation and the erasing operation of the flash memory of the present embodiment are executed by a well-known technique.

(c) Conclusion

The flash memory of the present embodiment includes a plurality of memory chips 700 (memory circuits 10).

Each of the memory chips 700 includes the output buffer circuit 160 and the calibration control circuit 190 that controls the impedance (for example, the ON resistance) of the output buffer circuit 160.

In the present embodiment, each of the memory chips 700 includes the resistance element 191 for the calibration of the output buffer circuit 160. The resistance element 191 is connected to the terminal 90 and the calibration control circuit 190 provided in the memory chip 700. The resistance element 191 is provided inside the chip of the memory chip 700.

The flash memory of the present embodiment is capable of executing the calibration operation of the output buffer circuit 160 in the background during the busy period of the memory chip after receiving the read command.

Therefore, the flash memory of the present embodiment is capable of executing the calibration operation for the output buffer circuit 160 without having to independently secure a calibration period within the read sequence period.

This allows the flash memory of the present embodiment to shorten the read sequence period including the calibration period.

Therefore, the operation speed of the flash memory of the present embodiment can be improved.

In the flash memory of the present embodiment, the calibration resistance element 191 is provided for each memory chip 700. Therefore, in the present embodiment, each of the memory chips 700 is capable of executing the calibration operation independently.

Therefore, in the flash memory of the present embodiment, the selected memory chip is capable of executing the calibration operation for the output buffer circuit 160 inside the chip 700 non-synchronously with the other memory chips, and without influencing the other memory chips. In the flash memory of the present embodiment, during the period in which the ready/busy signal RBn is set to a busy state, the circuit to which the power supply voltage VCCQ is supplied does not operate.

As a result, the flash memory of the present embodiment is capable of executing a stable calibration for the output buffer circuit 160 in a state where the influence of noise is suppressed.

Furthermore, in the present embodiment, the power supply system of the ground voltage VSSQ of the buffer circuits 150 and 160 is electrically separated from the power supply system of the ground voltage VSS of the other circuits. Therefore, the flash memory of the present embodiment is capable of executing the calibration operation for the output buffer circuit 160 (the impedance of the data line) in a state where the noise is further suppressed.

The flash memory of the present embodiment is capable of automatically executing the calibration operation of the output buffer circuit every time the read command is received, without transmitting and receiving the calibration command. As a result, the flash memory of the present embodiment can improve data transfer reliability.

As mentioned above, the semiconductor device of the present embodiment is capable of improving operating characteristics.

(2) Second Embodiment

A semiconductor device (for example, a flash memory) of a second embodiment will be explained using FIG. 8.

Figure 8:
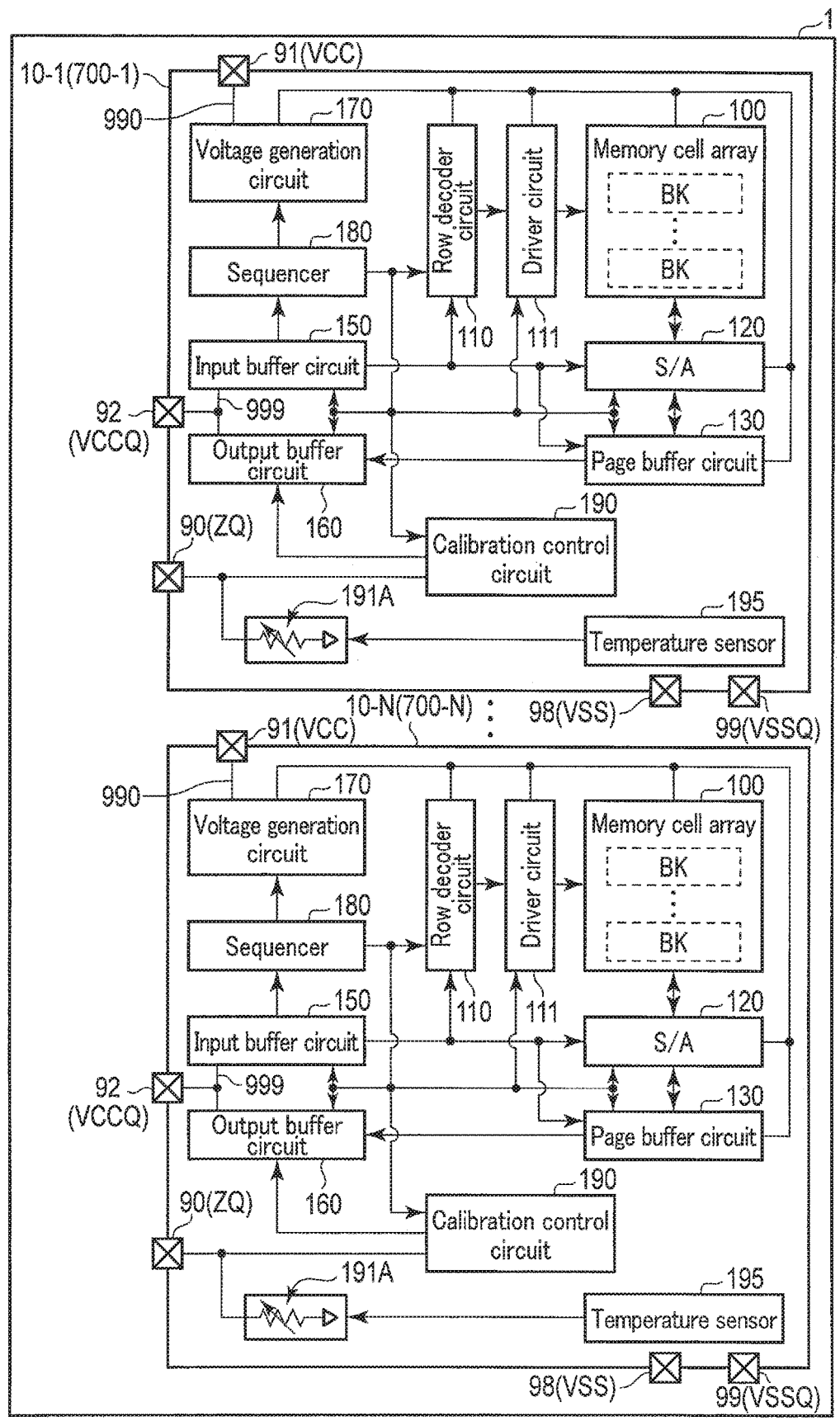
FIG. 8 is a diagram showing a configuration example of a semiconductor device of a second embodiment.

FIG. 8 shows an example of the internal configuration of the flash memory of the present embodiment.

As shown in FIG. 8, in the flash memory of the present embodiment, each of the memory chips 700 (memory circuits 10) includes a temperature sensor 195.

The temperature sensor 195 monitors and senses the temperature inside the chip 700. For example, the temperature sensor 195 starts sensing the temperature of the chip 700 by reception of a read command serving as a trigger.

The temperature sensor 195 controls the resistance value of a calibration resistance element 191A inside the memory circuit 10 by using a control signal that is based on the sense result of the chip temperature. The calibration resistance element 191A is, for example, a variable resistance element.

For example, when the temperature of the chip increases, the resistance value of the resistance element tends to increase. On the other hand, when the temperature of the chip decreases, the resistance value of the resistance element tends to decrease.

In the flash memory of the present embodiment, the resistance value of the calibration resistance element (variable resistance element) 191A is controlled based on the sense result of the temperature sensor 195 so that a constant resistance value is obtained without depending on the temperature of the chip.

This allows the flash memory of the present embodiment to execute calibration on the ON resistance for the output buffer circuit 160 with comparatively high precision.

In the present embodiment, the temperature sensor 195 may monitor the temperature of the chip 700 constantly in a period where the power supply voltage is applied to the memory system 9.

In the present embodiment, the resistance circuit including a plurality of resistance elements may be connected to a terminal 90 (calibration control circuit 190). Based on the control signal from the temperature sensor 195, one or more resistance elements among a plurality of resistance elements are used for the calibration of the ON resistance of the output buffer circuit 160.

As mentioned above, the memory device of the second embodiment is capable of improving operating characteristics.

(3) Third Embodiment

A semiconductor device (for example, a flash memory) of a third embodiment will be explained using FIG. 9.

Figure 9:
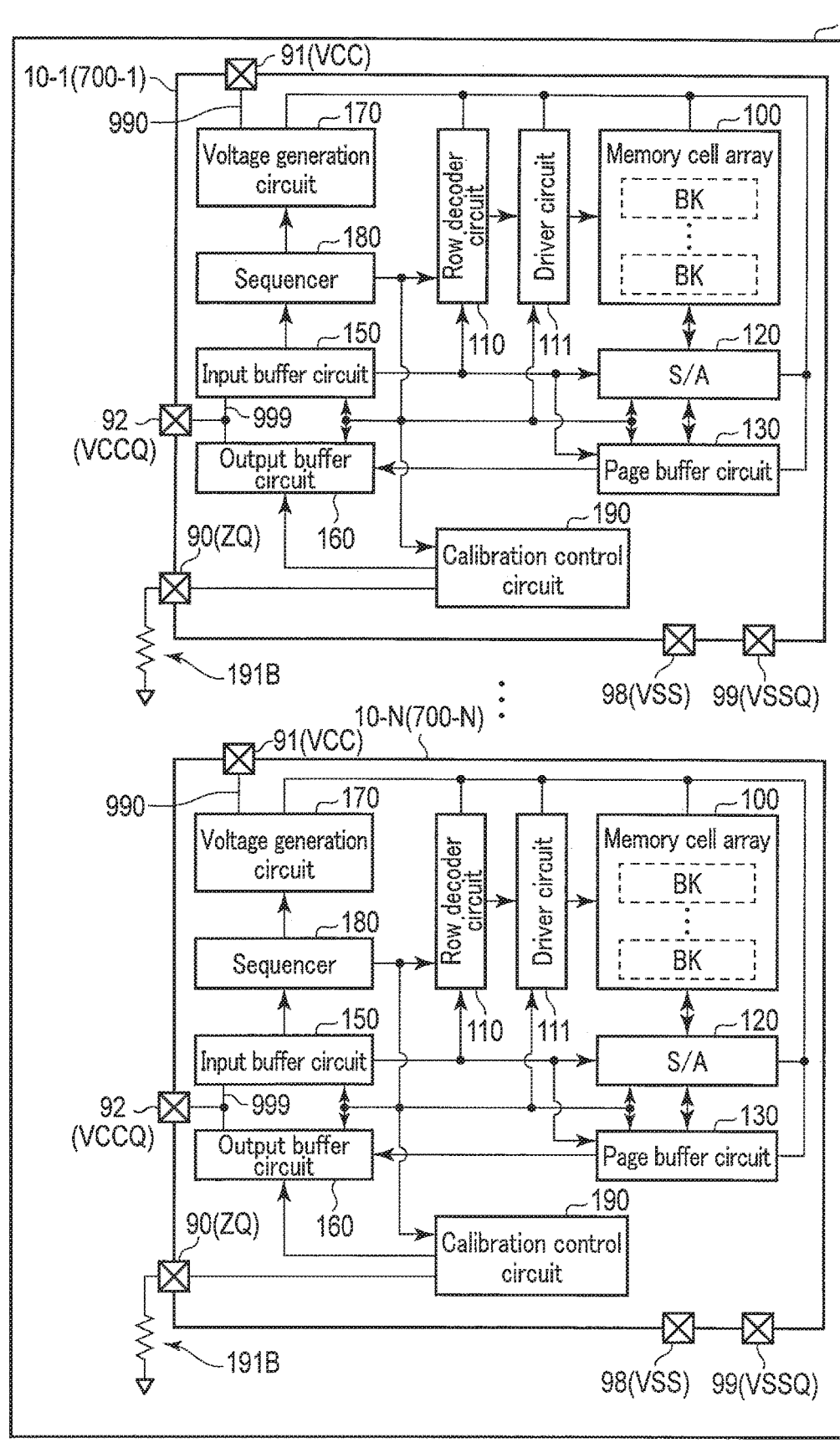
FIG. 9 is a diagram showing a configuration example of a semiconductor device of a third embodiment.

FIG. 9 shows an example of the internal configuration of the flash memory of the present embodiment.

As shown in FIG. 9, a calibration resistance element 191B may be provided outside a chip 700 as long as it is provided for each memory chip 700.

In this case, the calibration resistance element 191B is provided on, for example, the package substrate 900 of FIG. 2.

The number of calibration resistance elements (or calibration resistance circuits) 191B on the package substrate 900 is the same as the number of memory chips 700 laminated on the package substrate.

As in the present embodiment, even if the calibration resistance element 191B is provided outside the chip, as long as each of the calibration resistance elements 191B is provided for each memory chip 700 (memory circuit 10), the same effect as the above-mentioned embodiments can be obtained.

Therefore, the memory device of the third embodiment can produce the same effect as the first and the second embodiments.

(4) Modification

A modification of the semiconductor device (for example, a flash memory) of the embodiments will be explained using FIG. 10.

Figure 10:
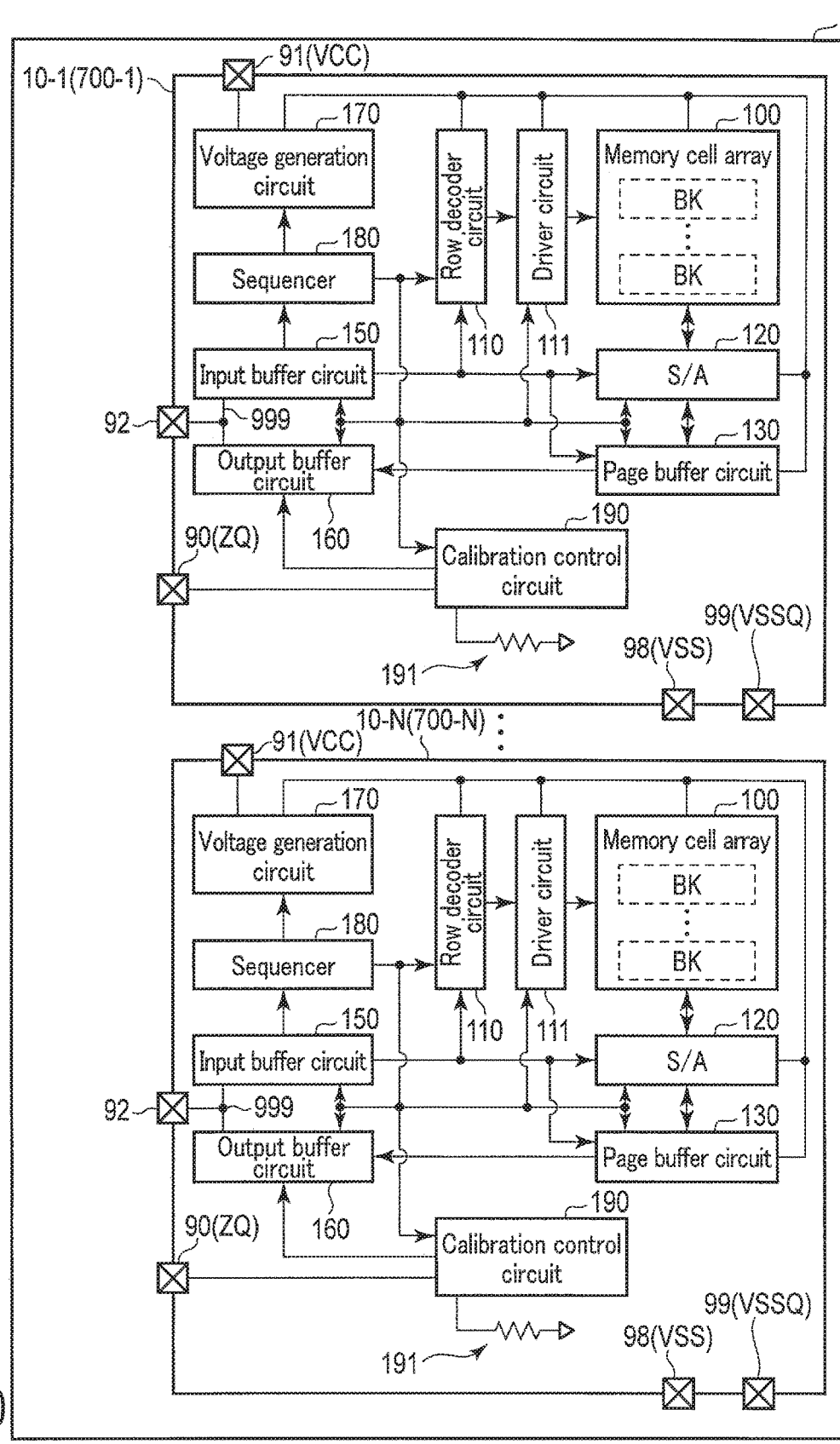
FIG. 10 is a diagram showing a modified example of the semiconductor device of the embodiments.

FIG. 10 shows an example of the internal configuration of the flash memory of the present modification.

As shown in FIG. 10, a calibration resistance element 191 may be directly connected to a calibration control circuit 190.

In this case, a ZQ terminal 90 does not have to be provided. In FIG. 10, as in the second embodiment, a temperature sensor may be provided inside a memory chip 700.

The flash memory of the present modification can produce the same effect as the above-mentioned embodiments.

(5) Others

In the above-mentioned embodiments, a NAND type flash memory has been exemplified to explain the semiconductor device of the embodiments.

However, the semiconductor device of the present embodiments may also be a memory device other than the NAND type flash memory. For example, the memory device of the present embodiments may be a device selected from an MRAM, a ReRAM, a DRAM, and an SRAM, etc. The above-mentioned embodiments are not limited to a memory device. Devices other than a memory device may be adopted in the present embodiments. The semiconductor device of the present embodiments may be, for example, a semiconductor device selected from a processor, a controller (for example, a memory controller), a wireless communication device, and a system LSI.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for controlling a memory system including a controller chip and at least one non-volatile memory chip which includes a calibration control circuit, a first output buffer circuit, and a first resistance element, the method comprising:
   receiving a read command from the controller chip;
   setting a ready/busy signal to a busy state based on the read command;
   executing a calibration operation which controls an impedance of the first output buffer circuit based on the read command;
   setting the ready/busy signal to a ready state; and
   sending data to the controller chip in response to the read command,
   wherein the calibration control circuit calibrates the impedance of the first output buffer circuit by using the first resistance element within a period in which the ready/busy signal is the busy state.

2. The method for controlling the memory system according to claim 1, further comprising:
   sensing a temperature of the at least one non-volatile memory chip by a temperature sensor of the at least one non-volatile memory chip; and
   controlling a resistance value of the first resistance element based on a sense result of the temperature.

3. The method for controlling the memory system according to claim 1, wherein the calibration operation is executed in synchronization with the receiving the read command.

4. The method for controlling the memory system according to claim 1, wherein the at least one non-volatile memory chip is a chip of a NAND flash memory.

5. The method for controlling the memory system according to claim 1, wherein:
   the at least one non-volatile memory chip further includes a first terminal, and
   the first resistance element is connected to the first terminal.

6. The method for controlling the memory system according to claim 1, wherein:
   the at least one non-volatile memory chip further includes a second terminal and a first interconnect electrically separated from the second terminal,
   a first voltage is supplied to the second terminal, and
   a second voltage is supplied to the first output buffer circuit through the first interconnect.

7. The method for controlling the memory system according to claim 6, wherein:
   the at least one non-volatile memory chip further includes a third terminal connected to the first interconnect, and
   the second voltage is supplied to the third terminal.

8. The method for controlling the memory system according to claim 6, wherein:
   the at least one non-volatile memory chip further includes a fourth terminal and a fifth terminal electrically separated from the fourth terminal,
   a third voltage lower than the first voltage is supplied to the fourth terminal, and
   a fourth voltage lower than the second voltage is supplied to the fifth terminal.

9. The method for controlling the memory system according to claim 1, wherein:
   the at least one non-volatile memory chip comprises a plurality of non-volatile memory chips,
   each of the plurality of non-volatile memory chips includes the first resistance element, and
   each of the plurality of non-volatile memory chips executes the calibration operation using the first resistance element.

10. The method for controlling the memory system according to claim 9, wherein, when the controller chip commands the plurality of non-volatile memory chips to perform an operation, a signal level of a chip enable signal of a memory chip to be an operation target among the plurality of non-volatile memory chips is set at a level indicating the operation target.

11. The method for controlling the memory system according to claim 1, wherein the first resistance element is directly connected to the calibration control circuit.

* * * * *